United States Patent
Horiguchi

(10) Patent No.: US 7,934,468 B2
(45) Date of Patent: May 3, 2011

(54) PLASMA PROCESSING APPARATUS AND PLASMA PROCESSING METHOD

(75) Inventor: Takahiro Horiguchi, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 818 days.

(21) Appl. No.: 11/762,472

(22) Filed: Jun. 13, 2007

(65) Prior Publication Data

US 2007/0289533 A1    Dec. 20, 2007

(30) Foreign Application Priority Data

Jun. 14, 2006   (JP) ................ 2006-165176

(51) Int. Cl.
C23C 16/00    (2006.01)
C23F 1/00    (2006.01)
H01L 21/306    (2006.01)

(52) U.S. Cl. ... 118/723 MW; 118/723 ME; 156/345.36; 156/345.41

(58) Field of Classification Search .......... 118/723 MW; 156/345.41
See application file for complete search history.

(56) References Cited

U.S. PATENT DOCUMENTS

| | | | | |
|---|---|---|---|---|
| 5,843,236 A * | 12/1998 | Yoshiki et al. | ......... | 118/723 MR |
| 6,091,045 A * | 7/2000 | Mabuchi et al. | ......... | 219/121.43 |
| 6,209,482 B1 * | 4/2001 | Doehler | ................ | 118/723 MW |
| 6,744,802 B1 * | 6/2004 | Tanaka et al. | .................... | 372/82 |
| 2001/0052322 A1 * | 12/2001 | Hirayama et al. | .... | 118/723 MW |
| 2004/0107910 A1 | 6/2004 | Nakata et al. | | |
| 2007/0034157 A1 | 2/2007 | Nakata et al. | | |

FOREIGN PATENT DOCUMENTS

| | | |
|---|---|---|
| AO | 2004-200646 | 7/2004 |
| JP | 2005-310478 | 11/2005 |
| JP | 2005-353364 | 12/2005 |

* cited by examiner

*Primary Examiner* — Parviz Hassanzadeh
*Assistant Examiner* — Rakesh Dhingra
(74) *Attorney, Agent, or Firm* — Oblon, Spivak, McClelland, Maier & Neustadt, L.L.P.

(57) ABSTRACT

Microwaves propagated through the waveguide 30, a plurality of slots 31 and the dielectric members 33 in this order are supplied into the processing chamber U where they are used to excite a gas to plasma to be used to process a substrate G. Alumina 50 fills an area inside the waveguide 30 near an end surface C thereof, and the remaining area inside the waveguide is filled with Teflon 35. Since the alumina 50 has a smaller guide wavelength $\lambda g$ compared to the Teflon 35, the mechanical length measured from the end surface C of the waveguide 30 to the center of the closest slot is reduced compared to the mechanical length of a waveguide filled only with Teflon 35 while maintaining the physical characteristic length from the end surface C to the closest slot center at $\lambda g/4$.

10 Claims, 8 Drawing Sheets

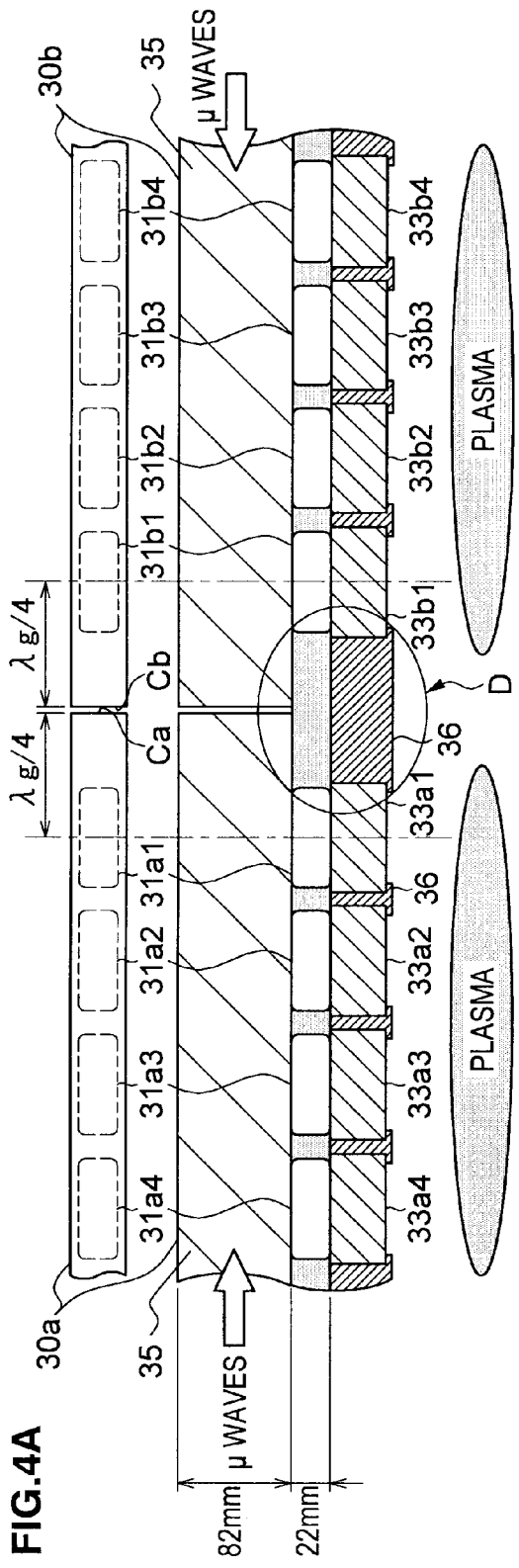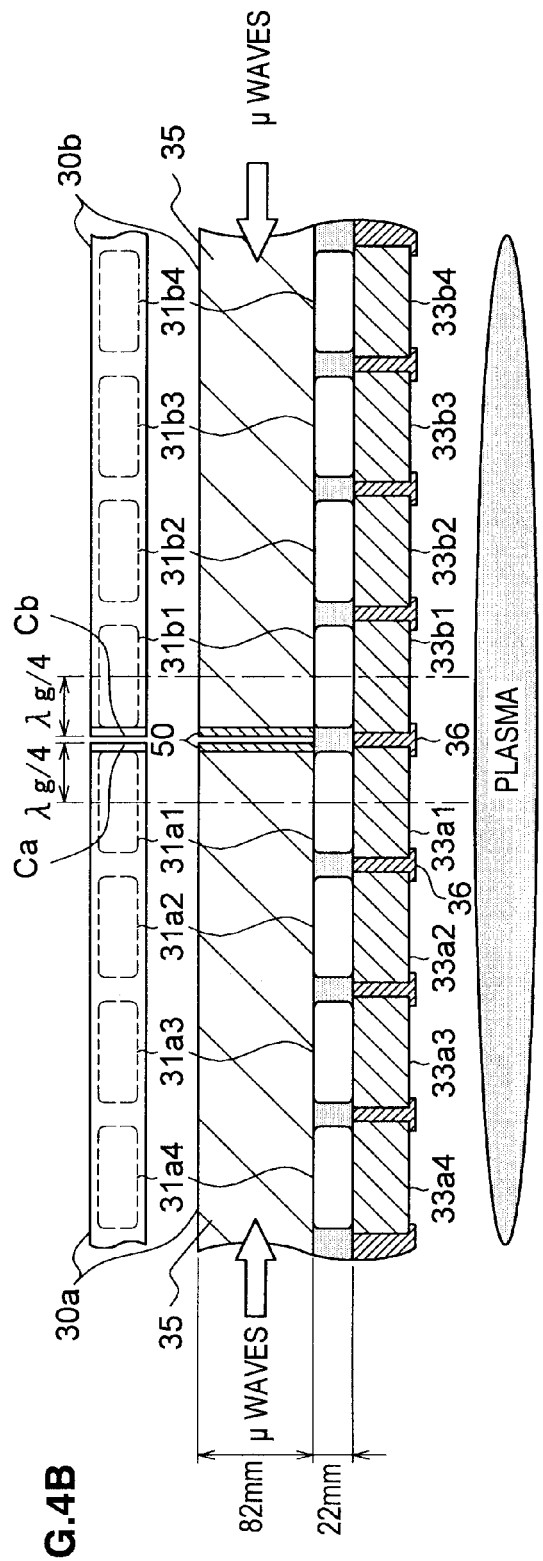

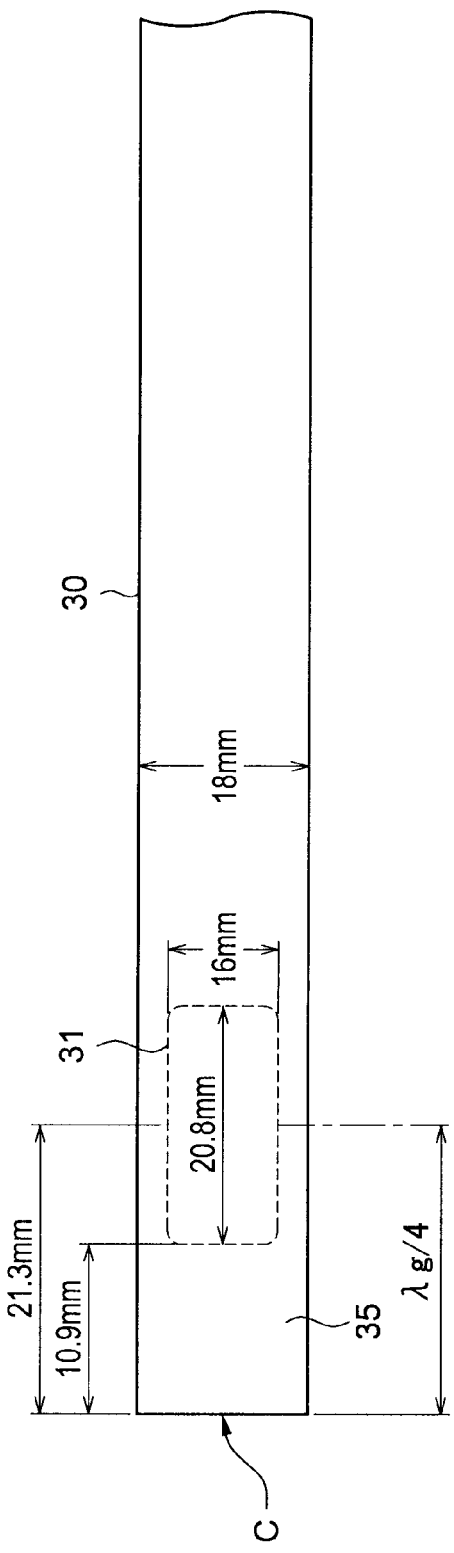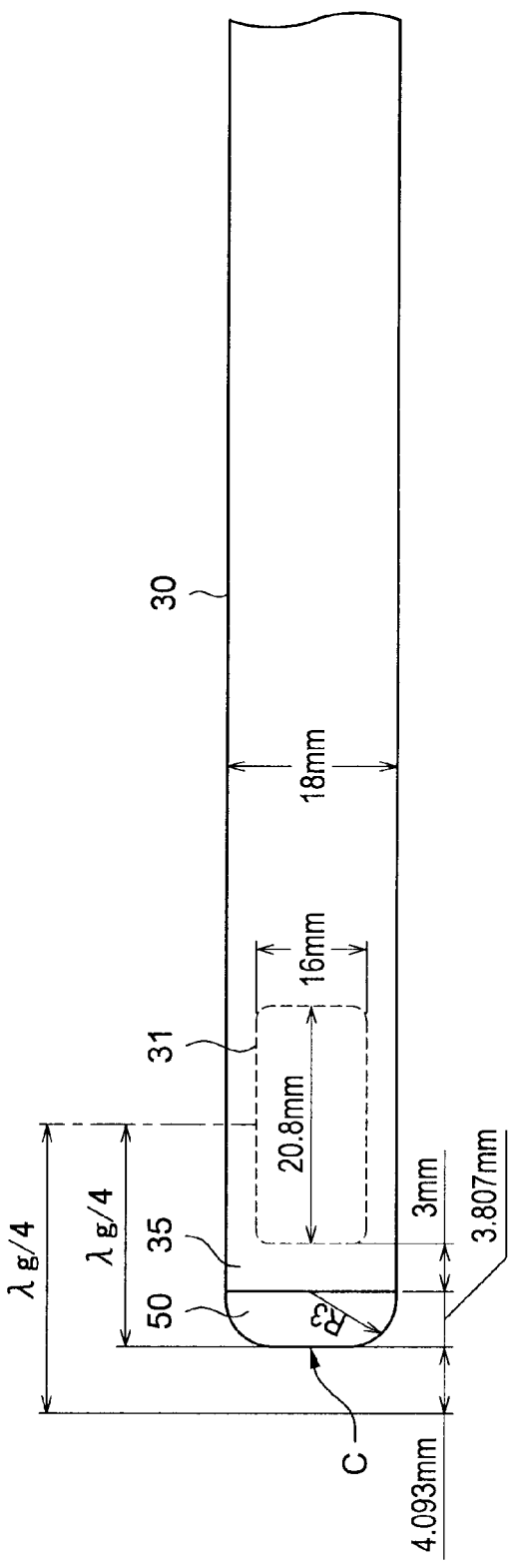
FIG.5A
FIG.5B

PLASMA PROCESSING APPARATUS AND PLASMA PROCESSING METHOD

CROSS REFERENCE TO RELATED APPLICATIONS

The present invention contains subject matter related to Japanese Patent Application No. JP 2006-165176, filed in the Japan Patent Office on Jun. 14, 2006, the entire contents of which are incorporated herein by reference

BACKGROUND OF THE INVENTION

1. Field of the Invention

The present invention relates to a plasma processing apparatus and a plasma processing method with which a workpiece to be processed is processed with plasma generated by energizing a gas to plasma with the power of microwaves. More specifically, the present invention relates to a plasma processing apparatus and a plasma processing method, in which the length of a waveguide is optimized by using a desired wavelength-varying substance.

2. Description of the Related Art

There is a technology known in the related art whereby a waveguide 90 is branched at points A1~A3 (π branches in the example presented in FIG. 7), a plurality of slots 92 are formed over equal intervals under a plurality of branched waveguides 91a~91f and a dielectric member 93 is disposed under the slots 92 so as to allow the power of microwaves to be supplied into a processing chamber of a plasma processing apparatus, as shown in FIG. 7. Through this power supply method, microwaves emitted from a microwave generator 94 are propagated through the waveguide 90 via a tuner 95, are branched into the individual waveguides 91 so as to travel through the slots at each waveguide 91 starting at, for instance, the slot 92a near the entrance and then through the subsequent slots in sequence ending at the slot 92e, are transmitted through the dielectric member 93 underneath the individual slots, and enter the processing chamber. A gas supplied into the processing chamber is raised to plasma with the electric field energy of the microwaves having entered the processing chamber as described above, and a workpiece is processed with the plasma thus generated.

As illustrated in the upper side of FIG. 8 in a sectional view of the plasma processing apparatus taken through II-II in FIG. 7, each time the microwaves, being supplied by adopting the power supply method described above, travel through one of the slots at the waveguide 91a, starting at the slot 92a closest to the entrance and then in the order of, 92b→92c→92d→92e, the amplitude of standing waves T, which are composite waves constituted with the microwaves advancing through the waveguide 91a and the microwaves reflected from an end surface C of the waveguide, becomes smaller. This means that the level of electrical field energy of the microwaves having traveled through the slots 92 and having entered the processing chamber, too, is higher in a space Ua inside the processing chamber under the slot 92a closest to the entrance to the waveguide and is lower over a space Ue in the processing chamber under the slot 92e closer to the end of the waveguide as indicated by an electrical field energy curve Emax in the lower side of FIG. 8. As a result, the plasma density is higher at positions closer to the entrance of each waveguide and is lower at positions closer to the end of the waveguide. The workpiece cannot be processed accurately with plasma generated in a non-uniform manner along the length of the waveguide as described above.

Uniformity in the electrical field energy of microwaves entering the processing chamber through the plurality of slots 92 may be achieved by adopting the following measures. Namely, the slot 92e in each waveguide, closest to the end surface C, may be set at such a position that its distance to the end surface C in a physical characteristic length is ¼ of the guide wavelength λg of the microwaves, and the slots 92a~92d may be each set at such a position that the closer the subject slot is to the entrance of the waveguide 91, the physical characteristic length between the subject slot and the adjacent slot deviates from ½ of the guide wavelength λg to a greater extent.

Thus, at the slot 92e, the position Pe of the peak of the standing wave is aligned with the central position Se of the slot 92e (W 1=0), which results in the level of the electrical field energy of microwaves supplied through the slot 92e to the position Ue in the processing chamber becoming equal to the maximum energy Emax for the position. As for the slots 92d through slot 92a, the extent of positional misalignment between the center (Sa–Sd) of the slot and the standing wave peak (Pa–Pd) is greater at a slot closer to the entrance of the waveguide 91 (W 5>W 4>W 3>W 2>W 1). A greater extent of positional misalignment results in the microwave electrical field energy supplied to a specific position among positions Ud, Uc, Ub and Ua in the processing chamber through the corresponding slot 92 being lower than the maximum energy for the position by a greater degree. Consequently, substantial uniformity is achieved in the electrical field energy of microwaves entering via the slots 92a through 92e as indicated by the line E in the electrical field energy of FIG. 8.

SUMMARY OF THE INVENTION

The waveguides 91 disposed above the slots in plasma processing apparatuses that process increasingly large substrates have also become larger and there are now waveguides measuring 1 m or more along the lengthwise direction. In such a case, numerous slots, e.g., 20 or more, may need to be formed along the length of each waveguide 91. As the length of the waveguide 91 and the quantity of slots both increase, it becomes more difficult to execute effective control by adopting the method of the related art to uniformly supply the electrical field energy of microwaves through the individual slots 92 and, as a result, plasma is bound to be generated with insufficient uniformity along the length of the waveguide 91.

In addition, as the level of the microwave electrical field energy output through the individual slots 92 becomes inconsistent as described above, the impedance in the plasma, which is a conductor, fluctuates. While the plasma processing apparatus typically includes a tuner for impedance matching as a measure against impedance fluctuation, constant fluctuation of the impedance in the plasma destabilizes the impedance matching, making it even more difficult to achieve substantial uniformity with regard to the microwave electrical field energy output from the various slots 92. In other words, it has become more difficult in a plasma processing apparatus that processes large substrates to successfully address the concern with regard to the non-uniformity in the plasma generated along the length of the waveguides simply by adopting the measures in the related art.

The present invention addresses the issues discussed above by providing a new and improved plasma processing apparatus and a new and improved plasma processing method, with which uniform plasma is generated by optimizing the length of the waveguides through the use of a desirable wavelength-varying substance.

According to an embodiment of the present invention, there is provided a plasma processing apparatus, including: a waveguide through which microwaves are transmitted; a slot antenna that includes a plurality of slots adjacent to the waveguide, through which the microwaves propagated via the waveguide are passed; a first wavelength-varying substance filling the inside of the waveguide, which alters a guide wavelength λg of the microwaves to a first wavelength; a second wavelength-varying substance inserted over an area located between an end surface of the waveguide, where the microwaves are reflected, and a center of a slot closest to the end surface, in place of the first wavelength-varying substance, which alters the guide wavelength λg of microwaves transmitted through the insertion area to a second wavelength smaller than the first wavelength; a plurality of dielectric members disposed adjacent to the slot antenna, through which the microwaves passed through the plurality of slots at the slot antenna are transmitted; and a processing chamber where a subject to be processed is processed by plasma generated with a gas excited by the microwaves transmitted through the plurality of dielectric members.

In the plasma processing apparatus with the waveguide filled with the first wavelength-varying substance and the second wavelength-varying substance, instead of the first wavelength-varying substance, filling a space located between the waveguide end surface at which microwaves are reflected and the center of the slot closest to the end surface, the guide wavelength λg of the microwaves propagating through the area filled with the second wavelength-varying substance can be altered from the first wavelength to the second wavelength shorter than the first wavelength. As a result, the mechanical length (i.e., the actual length as visually measured) from the waveguide end surface to the center of the slot closest to the end surface can be reduced while retaining the physical characteristic length (i.e., the guide wavelength of the microwaves) between them at a desired length.

Since this structure allows the mechanical length measured from the waveguide end surface to the center of the slot closest to the end surface, to be reduced compared to the corresponding mechanical length in a plasma processing apparatus in the related art with the waveguide thereof filled with a single wavelength-varying substance, the dead space (see the dead space D in FIG. 4A) formed near the lower portion of the end surface of the waveguide can be minimized (see FIG. 4B). Since this, in turn, allows a dielectric member to be disposed in the area near the lower portion of the end surface of the waveguide, which would be the dead space D in the related art, a plurality of dielectric members can be disposed next to the slots over equal intervals over the entire ceiling of the processing chamber. Consequently, microwaves transmitted through the individual dielectric members via the slots are delivered uniformly over the ceiling surface of the processing chamber, enabling the generation of uniform plasma under the ceiling surface of the processing chamber. Thus, the subject to be processed can be accurately processed by using desirable plasma.

The second wavelength-varying substance, altering the guide wavelength λg of the microwaves transmitted through the insertion area to the second wavelength, which is smaller than the first wavelength, may allow a mechanical length measured between the end surface of the waveguide and the center of the slot closest to the end surface to be reduced to a desirable length while maintaining a physical characteristic length between the end surface and the closest slot center at ¼ of the guide wavelength λg.

In the plasma processing apparatus, the physical characteristic length between the waveguide end surface and the center of the slot closest to the end surface is kept at ¼ of the guide wavelength λg of the microwaves. Since this sets the peak of standing waves in the microwaves aligned at the center of the slot closest to the waveguide end surface, the electrical field energy of the microwaves supplied into the processing chamber through the closest slot matches the maximum energy for the position. Consequently, plasma with high plasma density can be uniformly generated with the microwave electrical field energy achieving the maximum level for the position.

The plasma processing apparatus may include a plurality of waveguides, wherein: each waveguide may be disposed so that an end surface of the each waveguides faces opposite an end surface of one of the other waveguides.

A plurality of waveguides disposed above and adjacent to the slots, as shown in FIG. 7, in plasma processing apparatuses in the related art that process increasingly large substrates (730 mm×920 mm or larger) may measure 1 m or greater along the lengthwise direction. In such a case, numerous slots (e.g., 20 or more slots) may be present under a single waveguide, making it difficult to achieve uniformity in the microwave electrical field energy traveling through the individual slots as explained earlier.

According to the present invention, an end surface of a given waveguide is set so as to face opposite an end surface of one of the other waveguides, as shown in FIG. 2. By adopting this structure, the measurement of the waveguides taken along the lengthwise direction can be reduced to ½ that in the related art and the quantity of slots present along the lengthwise direction, too, can be 1.2 that in the related art. In other words, the structure facilitates control executed so as to achieve uniformity for the microwave electrical field energy supplied through the various slots present along the lengthwise direction.

It is to be noted that the plasma processing apparatus shown in FIG. 2 processes a substrate G in a 1100 mm×1300 mm size (G5 substrate size) with the power of microwaves output from eight microwave generators 34 disposed in two groups of four microwave generators facing opposite each other. While an illustration of an apparatus that processes a substrate G in a 730 mm×920 mm size (G4.5 substrate size) is not provided, such an apparatus should assume a structure corresponding to ½ of the plasma processing apparatus in FIG. 2 split along the longitudinal direction at the center thereof, with the quantities of the waveguides (30), the tuners (38) and the microwave generators (34) each reduced to ½ that in the plasma processing apparatus in FIG. 2. The plasma processing apparatus processes the substrate G in the G4.5 substrate size with the power of the microwaves output from the four microwave generators 34 installed in two groups, each made up with two microwave generators facing opposite each other.

In the plasma processing apparatus with the waveguides disposed so as to face opposite each other as described above, too, the second wavelength-varying substance is used to fill the space near the end of each waveguide according to the present invention. Thus, the mechanical length between the waveguide end surface and the center of the closest slot can be reduced while sustaining the physical characteristic length between the waveguide end surface and the closest slot center at ¼ of the guide wavelength λg (see FIG. 4B). As a result, the mechanical length (the actual length as visually measured) from the slot closest to the end of a waveguide to the slot closest to the end of the opposite waveguide, can be made to substantially match the mechanical length (the actual length as visually measured) between the slots present under a single waveguide. At the same time, the microwave electrical field energy supplied into the processing chamber through the closest slot achieves the maximum energy level for the position.

The structure allows the plurality of dielectric members present under the slots to be disposed over equal intervals over the entire ceiling surface of the processing chamber. Since microwaves with large uniform power having traveled through the individual slots can be supplied evenly over the entire ceiling surface of the processing chamber, plasma can be generated uniformly in a stable manner over the entire ceiling surface of the processing chamber. Consequently, the subject to be processed can be processed with desirable plasma with a high level of accuracy.

The second wavelength-varying substance and the first wavelength-varying substance may be each constituted of a dielectric material; and a dielectric constant of the second wavelength-varying substance may be higher than a dielectric of the first wavelength-varying substance. The plurality of dielectric members may be disposed over equal intervals by inserted the second wavelength-varying substance in the waveguide.

The guide wavelength $\lambda g$ of the microwaves can be expressed as $\lambda g = \lambda c/(\in)^{1/2}$. $\lambda c$ represents the wavelength in the free space whereas $\in$ represents the dielectric constant of the dielectric members. The expression indicates that as the dielectric constant $\in$ of the dielectric members becomes higher, the guide wavelength $\lambda g$ becomes smaller. Accordingly, by filling a space located between the waveguide end surface and the center of the closest slot with the second wavelength-varying substance constituted of a dielectric material achieving a higher dielectric constant compared to the first wavelength-varying substance, the mechanical length between the waveguide end surface and the closest slot center can be reduced compared to a plasma processing apparatus in the related art with the waveguide filled with the first wavelength-varying substance alone, while maintaining the physical characteristic length between the waveguide end surface and the closest slot center at ¼ of the guide wavelength $\lambda g$ of the microwaves. Consequently, the dead space D that would otherwise be formed under the end of the waveguide is eliminated, allowing the plurality of dielectric members to be disposed over equal intervals.

The each waveguide may be set adjacent to 20 slots or less present side-by-side on an axis extending parallel to the length of the waveguide; and a physical characteristic length between one slot and the next slot may be ½ of the guide wavelength $\lambda_g$.

The number of slots present along the lengthwise direction under each waveguide in this plasma processing apparatus does not exceed 20. Thus, the microwave electrical field energy delivered through the individual slots present along the lengthwise direction can be controlled with ease so as to assure uniformity in the electrical field energy level. In addition, the physical characteristic length between the slots is set to ½ of the guide wavelength $\lambda g$ of the microwaves. The peak of standing waves of the microwaves is thus set at the center of each slot. Consequently, the microwave electrical field energy supplied into the processing chamber through each slot achieves the maximum energy level for the slot position. Ultimately, plasma with high plasma density and achieving a high level of uniformity can be generated with the microwave electrical field energy assuming the maximum values for the individual slot positions.

At least one of either recesses and projections may be formed at surfaces of the plurality of dielectric members, which face opposite the subject to be processed.

With recesses or projections formed at each dielectric member, the extent of electrical field energy loss occurring as surface waves propagate at the lower surface of the dielectric member, can be increased. Thus, with the surface wave propagation inhibited, the occurrence of standing waves is minimized, thereby enabling generation of even more uniform plasma.

According to another embodiment of the present invention, there is provided a plasma processing method to be adopted when processing a subject to be processed by plasma in a plasma processing apparatus which includes a waveguide filled with a first wavelength-varying substance, a slot antenna having a plurality of slots adjacent to the waveguide and a plurality of dielectric members disposed adjacent to the slot antenna, including: transmitting microwaves by altering a guide wavelength $\lambda g$ of microwaves to a first wavelength with the first wavelength-varying substance filling the inside of the waveguide and transmitting microwaves by altering the guide wavelength $\lambda g$ of microwaves transmitted through an insertion area located between an end surface of the waveguide and a center of a slot closest to the end surface, which is filled with a second wavelength-varying substance instead of the first wavelength-varying substance to a second wavelength smaller than the first wavelength; transmitting through the plurality of dielectric members microwaves passed through the plurality of slots via the waveguide, to be; and processing a subject to be processed by plasma generated with a gas excited by the microwaves transmitted through the plurality of dielectric members.

In the plasma processing apparatus described above, with the second wavelength-varying substance filling the space between the waveguide end surface and the closest slot center, rather than having the entire internal space of the waveguide filled only with the first wavelength-varying substance, the guide wavelength $\lambda g$ of the microwaves propagated through the area filled with the second wavelength-varying substance can be altered to the second wavelength smaller than the first wavelength. This allows the mechanical length between the waveguide end surface and the closest slot center to be reduced compared to a plasma processing apparatus in the related art with the waveguide filled only with the first wavelength-varying substance, while maintaining the physical characteristic length from the waveguide end surface to the closest slot center at a desired value. This eliminates the dead space D that would be created in the related art under the end surface of the waveguide and allows a plurality of dielectric members to be disposed with equal intervals over the entire ceiling surface of the processing chamber. As a result, microwaves with uniform power having passed through the individual slots can be delivered over the entire ceiling surface into the processing chamber. Thus, plasma can be generated uniformly and stably over the entire ceiling surface of the processing chamber.

As described above, according to the present invention, uniform plasma can be generated by optimizing the waveguide length with a desirable wavelength-varying substance.

BRIEF DESCRIPTION OF THE DRAWINGS

FIG. 4A shows the area near the ends of waveguides filled with Teflon alone and FIG. 4B shows the area near the ends of waveguides filled with Teflon and alumina;

FIG. 5A shows a simulation model with a waveguide filled with Teflon alone and the corresponding simulation results, and FIG. 5B shows a simulation model with a waveguide filled with Teflon and alumina and the corresponding simulation results;

DETAILED DESCRIPTION OF THE EMBODIMENT

Figure 1:
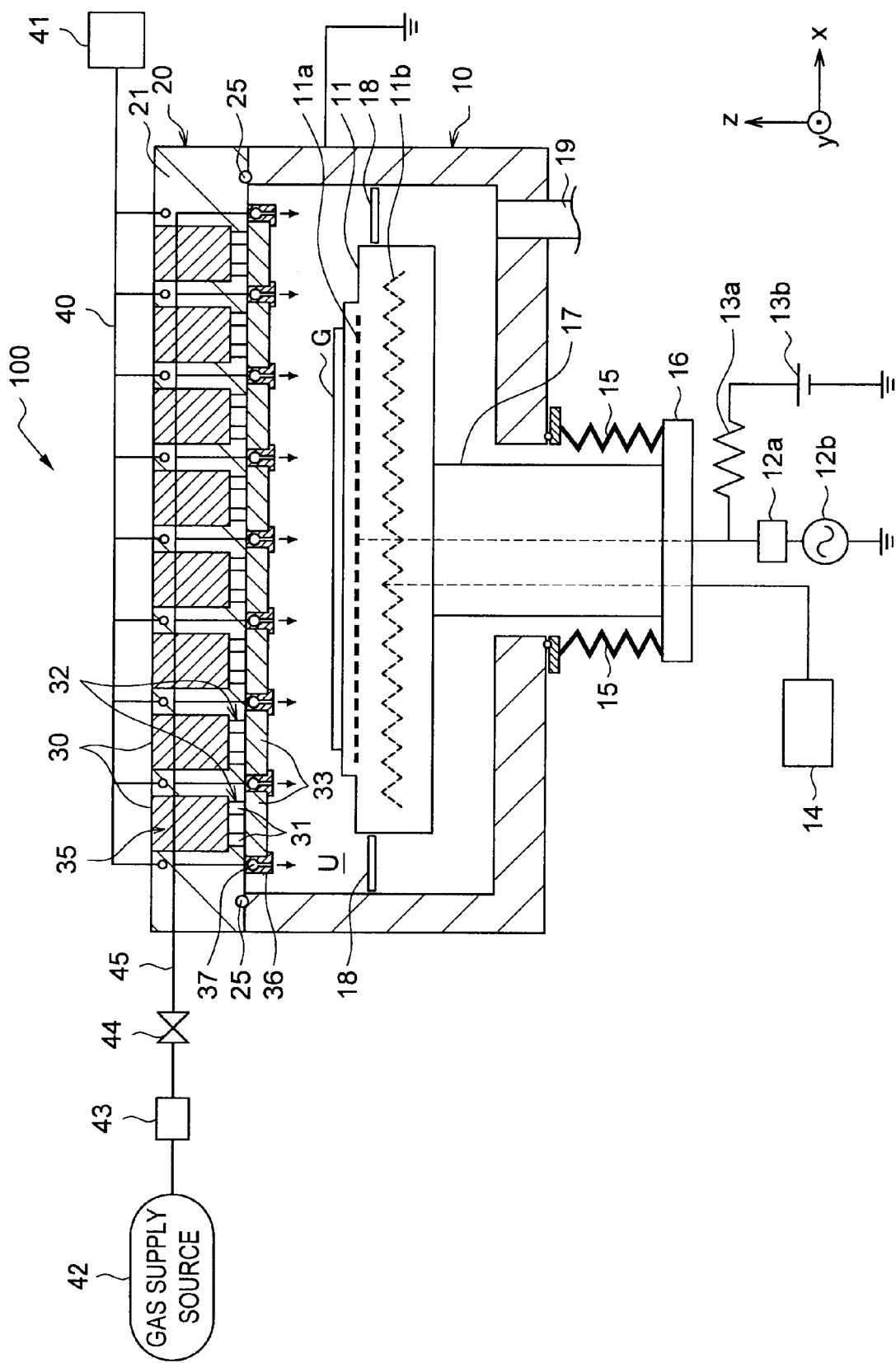
FIG. 1 is a longitudinal sectional view of the plasma processing apparatus achieved in an embodiment of the present invention, taken perpendicular to the y-axis.

The following is a detailed explanation of the plasma processing apparatus achieved in an embodiment of the present invention given in reference to the attached drawings. It is to be noted that in the following explanation and the attached drawings, the same reference numerals are assigned to components having identical structural features and functions to preclude the necessity for a repeated explanation thereof.

First Embodiment

Figure 2:
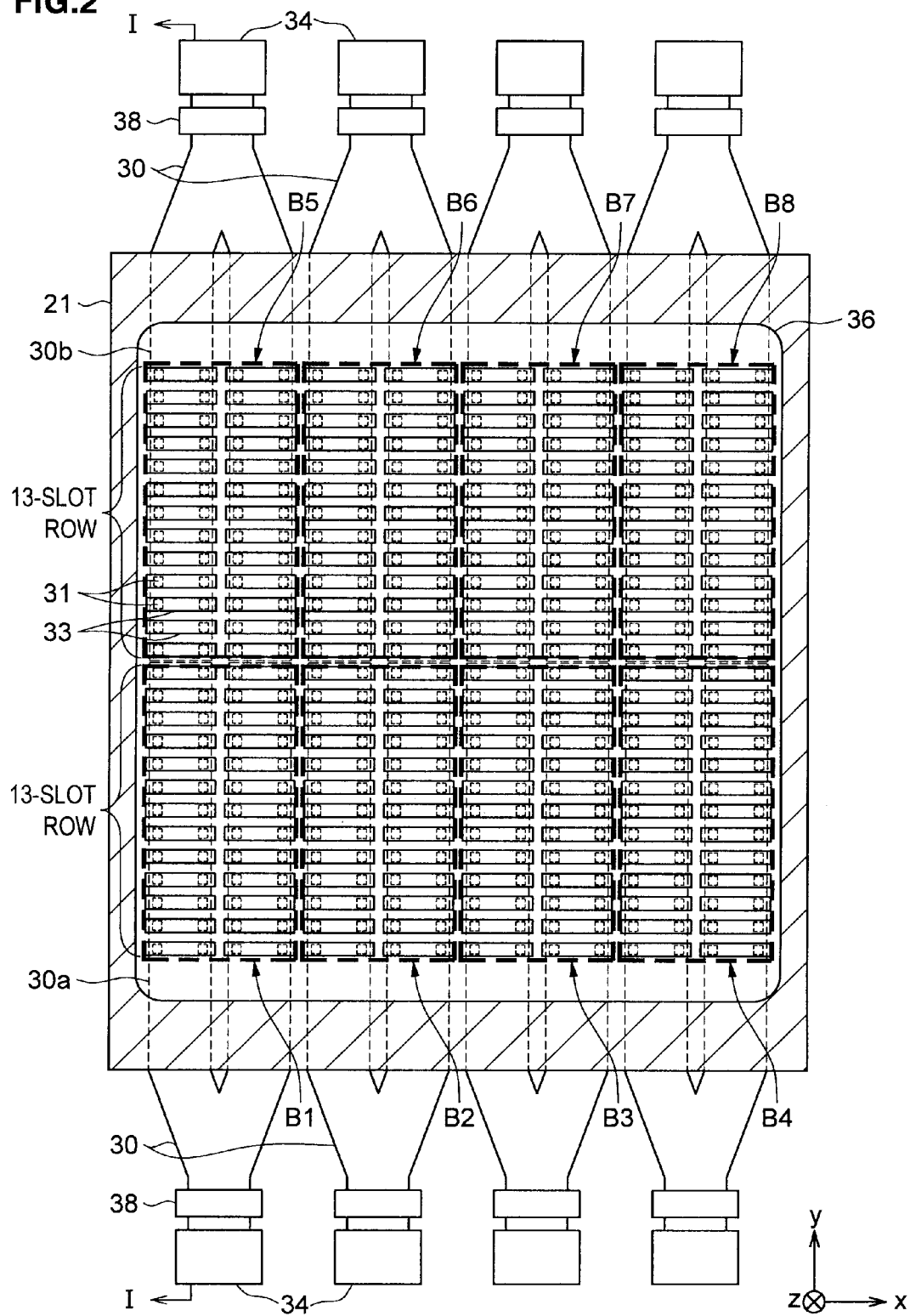
FIG. 2 shows the ceiling surface inside the processing chamber of the plasma processing apparatus achieved in the embodiment.

First, in reference to FIG. 1 presenting a sectional view of the plasma processing apparatus achieved in the embodiment of the present invention, taken along the longitudinal direction (the direction perpendicular to the y-axis), and FIG. 2 presenting a view of the ceiling of the processing chamber, the structure adopted in the microwave processing apparatus is explained. It is to be noted that the following explanation focuses on a micro plasma processing apparatus that processes a subject to be processed (hereafter referred to as a "substrate") with plasma generated by raising a gas to plasma with the power of microwaves achieved in the embodiment. The micro plasma processing apparatus is one example of the plasma processing apparatus.

(The Structure of Microwaves Plasma Processing Apparatus)

A microwave plasma processing apparatus 100 includes a processing container 10 and a lid 20. The processing container 10 assumes a solid-bottomed cubic shape with an open top. The processing container 10 and the lid 20 may be constituted of a metal such as aluminum, are electrically grounded.

Inside the processing container 10, a susceptor 11 (stage) on which a glass substrate G is placed is disposed. Inside the susceptor 11 constituted of, for instance, aluminum nitride, a power supply unit 11a and a heater 11b are installed.

A high-frequency power source 12b is connected to the power supply unit 11a via a matcher 12a (e.g., a capacitor). In addition, a high-voltage DC power source 13b is connected to the power supply unit 11a via a coil 13a. The matcher 12a, the high-frequency power source 12b, the coil 13a and the high-voltage DC power source 13b are all disposed outside the processing container 10. The high-frequency power source 12b and the high-voltage DC power source 13b are grounded.

The power supply unit 11a applies a predetermined level of bias voltage into the processing container 10 by using high-frequency power output from the high-frequency power source 12b. In addition, the power supply unit 11a electrostatically attracts and holds the substrate G with a DC voltage output from the high-voltage DC power source 13b.

An AC power source 14 disposed outside the processing container 10 is connected to the heater 11b, and the heater 11b thus maintains the temperature of the substrate G at a predetermined level by using an AC voltage output from the AC power source 14.

A cylindrical opening is formed at the bottom surface of the processing container 10, with one end of a bellows 15 attached to the outer circumferential edge of the opening on the bottom surface. The other end of the bellows 15 is locked to an elevator plate 16. The opening at the bottom surface of the processing container 10 is thus sealed with the bellows 15 and the elevator plate 16.

The susceptor 11, supported at a cylindrical member 17 disposed on the elevator plate 16, moves up and down as one with the elevator plate 16 and the cylindrical member 17, so as to adjust the height of the susceptor 11 at a position optimal for a specific processing operation. In addition, a baffle plate 18 is disposed around the susceptor 11 in order to control the gas flow in the processing chamber U in the optimal state.

A vacuum pump (not shown) disposed outside the processing container 10 is present near the bottom of the processing container 10. As the gas is exhausted with the vacuum pump from the processing container 10 via a gas exhaust pipe 19, the pressure inside the processing chamber U is lowered until a desired degree of vacuum is achieved.

At the lid 20, a lid main body 21 waveguides 30, a slot antenna 30 having a plurality of slots 31 and a plurality of dielectric members are disposed. The area where the bottom circumferential portion of the lid main body 21 and the top circumferential portion of the processing container 10 come into contact with each other is sealed with an O-ring 25 so as to sustain the inner space in the processing chamber U in a sealed state.

As shown in FIG. 2, the waveguides 30 assuming a rectangular sectional shape are each connected to a microwave generator 34 at one end thereof via a tuner 38. The tuner 38 (e.g., a stub tuner) achieves impedance matching as a means for preventing impedance fluctuation in the plasma. The waveguides 30, each branching into two waveguides, are disposed at the lid main body 21 so as to terminate at the middle of the ceiling surface of the processing chamber U. Inside the lid main body 21, eight waveguides 30 are installed side-by-side along the x-axis and another set of waveguides 30, tuners 38 and microwave generators 34, all adopting structures identical to those described above, is installed on the opposite side as well so as to be symmetrical relative to the center of the ceiling. Thus, sixteen waveguides 30 in two groups each having eight waveguides disposed side-by-side are installed so that the end surfaces of the two waveguides 30 set on the two sides face opposite each other and eight microwave generators 34 are disposed in two groups each made up with four microwave generators 34, so that the two groups of microwave generators face opposite each other. In the processing chamber U of the microwave plasma processing apparatus 100 structured as described above, a substrate G (in the G5 substrate size) measuring 1100 mm×1300 mm (corresponds to the chamber size of 1470 mm×1590 mm) is processed as explained earlier. It is to be noted that while each waveguide is branched into two waveguides in the embodiment, the present invention is not limited to this example and the waveguides 30 may each be connected to a single microwave generator 34 on a one-to-one basis, instead.

Figure 3:
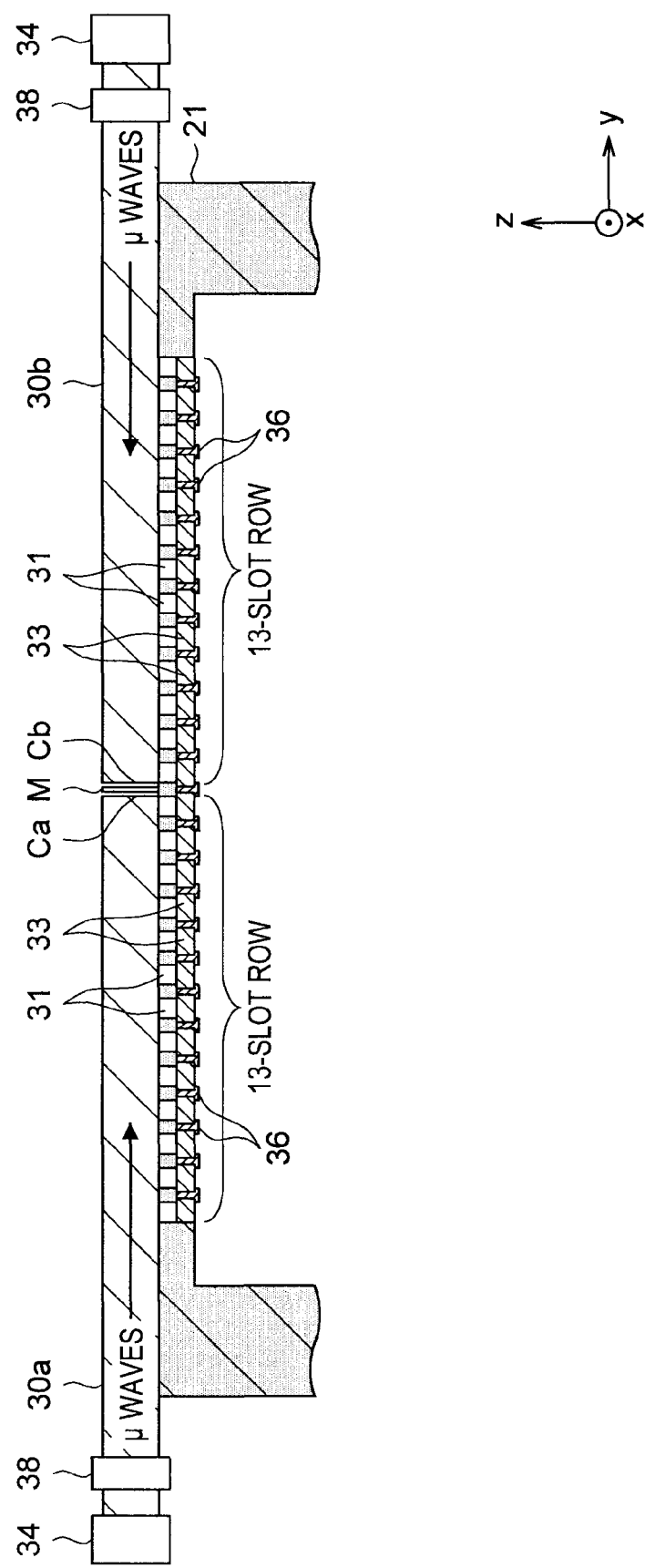
FIG. 3 is a longitudinal sectional view of the area near the lid main body of the plasma processing apparatus taken through the I-I plane in FIG. 2.

As shown in FIG. 3 in a sectional view of the microwave plasma processing apparatus 100 taken through the I-I plane in FIG. 2, a reflector M is disposed between end surfaces Ca and Cb of each pair of waveguides 30a and 30b facing opposite each other. The reflector M constituted of a metal such as aluminum reflects microwaves advancing through the waveguides 30 at end surfaces C thereof.

The space inside each of waveguides 30 is filled with a dielectric material such as a fluororesin (e.g., Teflon™, Polytetrafluoroethylene), alumina (Al2O3) or quartz. Thus, the guide wavelength λg1 of microwaves within each of rectangular waveguides 30 is controlled as indicated in expression; $\lambda g = \lambda c/(\in)^{1/2}$. λc and ∈ in the expression respectively represent the wavelength in free space and the dielectric constant of the dielectric member. It is to be explained that the space inside each of waveguides 30 is filled with Teflon™ 35 (refer to FIG. 1) as a dielectric material in the present embodiment.

As shown in FIG. 1, the slot antenna 32, located on the bottom side of each waveguides 30, is formed as an integrated part of the lid main body 21. The slot antenna 32 may be constituted of a nonmagnetic and electrically conductive material such as aluminum 13. As shown in FIG. 2, 13 slots (openings 31) of the slot antenna 32 are disposed by forming in two rows at the bottom surface of each waveguides 30. For instance, 26 slots of the slot antenna 30 are disposed at the bottom surface of waveguide 30a and waveguide 30b. The space inside each slots 31 is filled with a dielectric member constituted of a fluororesin, alumina (Al2O3) or quartz. Each of slots 31 is placed distance of degree of λg/2 (physical characteristic length) apart from an adjacent slot to a long side of the waveguide 30. It is to be noted that the quantity of the slot 31 located on the bottom side of each waveguides 30 does not need to be the above mentioned number, but is preferable within 20.

Each of dielectric members 33 is formed in shape of tile and is placed evenly apart from an adjacent dielectric member 33 so as to be perpendicular to a long side of the waveguide 30. 2 slots is disposed at the top of dielectric members 33 respectively. According to the structure described above, as a whole, 208 (=13×16) dielectric member 33 is provided at the surface of the ceiling.

A plurality of dielectric members 33 are constituted of the dielectric material such as glass quartz, AlN, Al2O3, sapphire, SiN, ceramics. Recessed portions and projecting portions are formed at the surface of each of dielectric members 33 facing opposite the substrate G (not shown). The presence of at least any one of recessed portions and projecting portions formed at the surface of the dielectric member 33 increases the loss of electrical field energy as the surface wave is propagated over the surface of the dielectric member 33 and thus, the extent of surface wave propagation is suppressed. As a result, the occurrence of a standing wave is inhibited, thereby uniform plasma enable be generated.

Each of dielectric members 33 is supported by the latticed beam 26 over peripheral edges of the dielectric members 33. The beam 26 is provided so that the beam 26 projects out toward a glass substrate G at peripheral edges of the each of dielectric parts 31. The beam 26 may be constituted of a nonmagnetic and electrically conductive material such as aluminum 13. As shown in FIG. 1, a plurality of gas supply pipes 37 go through inside the beam 26.

Cooling water pipes 40 are connected with a cooling water supply source 41 installed outside the microwave plasma processing apparatus 100 and as cooling water supplied from the cooling water supply source 41 circulates through the cooling water pipes 40 and returns to the cooling water supply source 41, the temperature at the lid main body 21 is maintained at a desired level.

A gas supply source 42 is connected to the mass flow controller 43 and the valve 44, father connected to a plurality of gas supply pipes 37 via a gas line 45. The gases outputted from the gas supply source 42 achieve a desired level of concentration by controlling the open/closed states of valve and the degrees of openness of the mass flow controller. The gases of a desired level are extended through the gas line 45 and the gas supply pipes 29 and are supplied into the processing chamber.

According to the structure described above, for instance, 2.45 GHz×3 microwaves are output from the eight microwave generators 40 in FIG. 2, transmit the dielectric members 31 through slots 31 via rectangular waveguides 30 and are supplied into the processing chamber U. Thereby, the substrate G is processed (for example, Chemical Vapor Deposition process) with plasma generated by raising a gas supplied from the gas supply source 42 with the power of microwaves.

(Issues to be Addressed when Processing Larger Substrates G)

Figure 8:
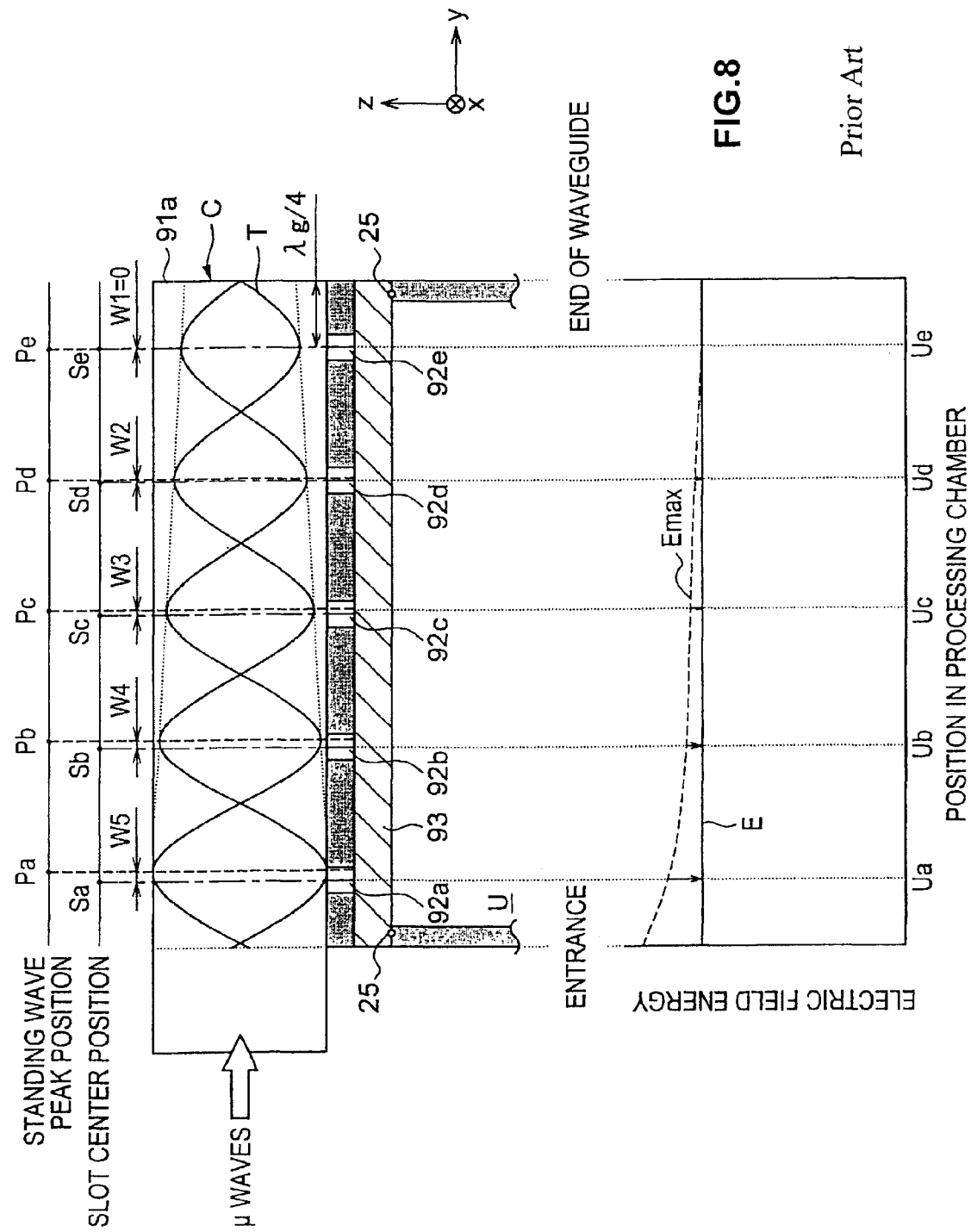
FIG. 8 is a diagram indicating the states of the electrical field energy of each slot indicated in a longitudinal sectional view of the plasma processing apparatus taken through the II-II plane in FIG. 7.

A plasma processing apparatus today typically processes larger substrates G, e.g., 730 mm×920 mm and larger, and waveguides 30 measuring 1 m or more along the lengthwise direction may need to be installed at the lid main body 21 of the plasma processing apparatus. In such a case, numerous slots 31, e.g., 20 slots or more, may be present side-by-side along the length of the waveguide 30 under each waveguide 30. In a plasma processing apparatus equipped with larger waveguides 30 with numerous slots 31 present under the waveguides 30, it is extremely difficult to control the power supply through the technology in the related art whereby uniformity in the electrical field energy is achieved simply by offsetting the slot center positions relative to the standing wave peak positions, as shown in FIG. 8. In other words, substantial uniformity in the microwave electrical field energy output through the individual slots 31 cannot be achieved readily, resulting in non-uniformity in the plasma generated with the electrical field energy along the length of the waveguides 30.

In addition, as the level of the microwave electrical field energy output through the individual slots 31 becomes inconsistent as described above, the impedance in the plasma, which is a conductor, fluctuates. While the plasma processing apparatus typically includes tuners 38 for impedance matching as a measure against impedance fluctuation, constant fluctuation of the impedance in the plasma destabilizes the impedance matching, making it even more difficult to achieve substantial uniformity with regard to the microwave electrical field energy output from the various slots 31. As a result, the plasma is generated in a notably non-uniform manner along the length of the waveguides 30.

(Positional Arrangement of Waveguides)

This issue is addressed by the inventor by disposing two waveguide groups, each made up with a plurality of waveguides 30 measuring 1 m or less, so that the end surfaces of the waveguides 30 in the two groups face opposite each other, as explained earlier. In other words, the inventor conceived a design in which the microwave power supply is controlled in units each corresponding to one of the eight blocks indicated as B1~B8 in FIG. 2 (i.e., the range over which microwaves emitted from a single microwave generator 34 propagate). Thus, as shown in FIGS. 2 and 3, the inventor succeeded in reducing the length of the individual waveguides 30 by half over the related art.

In addition, the inventor conceived the structure with slot rows, each made up with 13 slots 31 and running along the length of the waveguide 30, formed under the waveguides and 13 dielectric members 33 disposed under the slots 31 at each waveguide. This structure allows the length of the waveguides 30 to be reduced to 1 m or less and allows the number of slots 31 in a single row present side-by-side along the length of each waveguide to be 20 or less. In other words, the inventor succeeded in devising a positional arrangement for the waveguides 30 and the slots 31 such that they are disposed in blocks, in correspondence to each of which the microwave electrical field energy, supplied through the plurality of slots present side-by-side along the length of a given waveguide 30, can be controlled in an integrated manner.

(Issues that May Arise at the End Surfaces of Waveguides Facing Opposite Each Other)

When the two groups of waveguides 30 are disposed as described above so that the end surface of a waveguide in one group faces opposite the end surface of a waveguide in the other group, a dead space D, where neither a slot 31 nor a dielectric member 33 can be disposed, is formed under the end surfaces of the waveguides 30, as indicated in FIG. 4A presenting an enlargement of the area near the ends of the waveguides 30 shown in FIG. 3. Such a dead space is formed for the following reason. It is to be noted that the waveguides 30 are shown in a plan view on the top side of FIGS. 4A and 4B and that the waveguides 30, the slot antenna 32 and the dielectric members 33 are shown in a sectional view on the bottom side of FIGS. 4A and 4B.

The physical characteristic length measured from the end surfaces (facing opposite each other) Ca and Cb of the waveguides 30a and 30b to the centers of slots 31a1 and 31b1 closest to the corresponding end surfaces Ca and Cb must be kept at ¼ of the guide wavelength λg of the microwaves, so as to ensure that the electrical field energy of microwaves passing through the slots 31a1 and 31b1, transmitted through the dielectric members 33a1 and 33b1 disposed under the slots 31a1 and 31b1 and supplied into the processing chamber U, achieves the maximum energy level for the position by aligning the peaks of the standing waves, i.e., the composite waves made up with the advancing microwaves and the reflected microwaves, at the centers of the slots 31a1 and 31b1.

In the structure shown in FIG. 4A, Teflon 35 alone fills the inside of the waveguides 30. As explained earlier, the guide wavelength λg of the microwaves is expressed as λg=λc/(∈)$^{1/2}$. λc and ∈ in the expression respectively represent the wavelength in the free space (in the vacuum state) and the dielectric constant of the dielectric members. Since the dielectric constant of Teflon 35 is 2 and the wavelength λc in the free space is 120 mm, the guide wavelength $\lambda g_1$ in the waveguides 30 filled with the Teflon 35 only is calculated as expressed in (1) below.

$$\lambda g_1 = 120/(2)^{1/2} \quad (1)$$

Since λg/4=λg$_1$×¼=21.3 mm, the dead space D where neither a slot 31 nor a dielectric member 33 can be disposed is formed under the end surfaces Ca and Cb of the waveguides 30a and 30b.

The presence of such a dead space D under the end surface C of each waveguide lowers the plasma density under the dead space D compared to the plasma density over the other areas of the ceiling surface of the processing chamber, resulting in generation of inconsistent plasma. Such non-uniformity in the plasma generation occurs since neither a slot nor a dielectric member can be disposed under the dead space D and thus microwaves cannot be transmitted through the dead space D.

To explain this point in further detail, while the slots 31a1~31a4 and the slots 31b1~31b4 are disposed with equal intervals along the length of the respectively waveguides 30, the distance between the slots 31a1 and 31b1 respectively closest to the ends Ca and Cb of the waveguides 30a and 30b is greater than the intervals between the other slots due to the presence of the dead space D. Thus, while the dielectric members 33a1~33a4 and the dielectric members 33b1~33b4 are set over equal intervals under the corresponding slots 31 on the axis extending parallel to the length of the waveguides 30, no dielectric member can be disposed in the dead space D and thus, the distance between the dielectric member 33a1 and the dielectric member 33b1 is greater than the intervals between the other dielectric members. As a result, microwaves cannot be transmitted through the dead space D, resulting in a markedly lower plasma density level under the dead space D compared to the plasma density at the other areas over the ceiling surface of the processing chamber. This, in turn, results in non-uniform plasma generation. Such non-uniformity in the plasma being generated compromises the quality of plasma processing on a large substrate G, e.g., desirable film formation processing or the like cannot be executed on the large substrate G.

(Optimization of the Mechanical Length of the Waveguides)

Accordingly, the inventor conceived as a way of addressing the concerns with regard to inconsistent plasma generation near the ends of the waveguides, a structure with dielectric members 33 disposed with equal intervals over the entire ceiling surface of the processing chamber by inserting alumina 50 instead of the Teflon 35 in specific areas between the end surfaces Ca and Cb of the waveguides 30a and 30b and the centers of the slots 31a1 and 31b1 closest to the end surfaces Ca and Cb (near the ends of the waveguides 30 in FIG. 4B). Based upon this concept, the mechanical length between the end surfaces C and the closest slot center at the waveguides 30 is reduced while maintaining the physical characteristic length from the end surface C of each waveguide 30 to the center of the slot closest to the end surface at ¼ of the guide wavelength λg and thus, the dielectric members 33 can be disposed with equal intervals all over the ceiling surface by setting the guide wavelength $\lambda g_2$ of microwaves propagated through the areas of the waveguides 30 filled with the alumina 50 smaller than the guide wavelength $\lambda g_1$ of microwaves propagated through the areas of the waveguides 30 filled with the Teflon 35. More specifically, the guide wavelength $\lambda g_2$ of the waveguides 30 filled with the alumina 50 is reduced as indicated in expression (2) below relative to the guide wavelength $\lambda g_1$ (=λc/(2)$^{1/2}$) of the waveguides 30 filled with Teflon 35.

$$\lambda g_2 = \lambda c/(9)^{1/2} \quad (2)$$

Based upon the conceptual premise as described above, the inventor conducted a simulation in order to determine how much alumina 50 should be inserted near the end surface C, i.e., the range inside the waveguide, starting from the end surface C to be taken up by the alumina 50, to allow 208 dielectric members 33 to be disposed over equal intervals at the ceiling surface of the processing chamber U. The width measured along the shorter side of the waveguides 30 was 18 mm, the width measured along the shorter side of the slots 31 was 16 mm, the width measured along the longer side of the slots 31 was 20.8 mm and the end portion of the alumina 50 filling the end area of each waveguide 30 was R3 (with a radius of 3 mm) in the simulation model used in this simulation as indicated in FIGS. 5A and 5B. In addition, the height of the waveguides 30 was set to 82 mm and the height of the slots 31 was set to 22 mm as indicated in FIGS. 4A and 4B. The length measured from the end C of a given waveguide 30 to the center of the closest slot 31 was 21.3 mm. Accordingly, the shortest distance that may be assumed between the end surface C and the closest slot is calculated to be 10.9 (=21.3−20.8/2) mm.

As shown in FIG. 5A, the guide wavelength $\lambda gt_1$ of microwaves (the length assumed from the viewpoint of the microwaves), indicating the physical characteristic length, as opposed to the mechanical length 10.9 mm in the free space, is calculated as follows.

$$\lambda gt_1 = 10.9/(2)^{1/2} \quad (3)$$

The ratio of the distance 10.9 mm from the end surface C to the closest slot 31 measured in the free space (the ratio of the mechanical length) relative to the wavelength $\lambda c$ in the free space is equal to the ratio of the guide wavelength $\lambda gt_1$ between the end surface C and the closest slot (the ratio of the physical characteristic length) relative to the wavelength $\lambda g$ (guide wavelength) taken from the point of view of the microwaves propagated through the waveguides. Accordingly, the following expression is obtained by incorporating $\lambda gt_1/\lambda g = 10.9/\lambda c$, into expression (3) for substitution.

$$\lambda gt_1 = (10.9/\lambda c) \times \lambda g \quad (4)$$

Then, expression (4) is incorporated in expression (3) for substitution;

$$10.9 = (2)^{1/2} \times \lambda gt_1 = (2)^{1/2} \times (10.9/\lambda c \times \lambda g) = ((2)^{1/2} \times 10.9/120) \times \lambda g \quad (5)$$

By taking into consideration slight curvatures manifesting in the shape of the end portions of the waveguides and in the shape of the slots, which are inevitable due to the limits to machining accuracy, expression (5) is modified as follows.

$$10.9 \approx 0.107 \lambda g \quad (6)$$

Next, the physical characteristic length (the guide wavelength $\lambda ga$ of microwaves) is determined as expressed below in correspondence to the mechanical length 3.807 mm (in the free space) of the areas of the waveguides 30 filled at the ends thereof with the alumina 50 instead of the Teflon 35, as shown in FIG. 5B.

$$\lambda ga = 3.807/(9)^{1/2}$$

This expression can then be rewritten as $$3.807 = 3 \times \lambda ga = 3 \times (3.807/\lambda c \times \lambda g) \quad (7)$$

By taking into consideration the curvature expressed as R3 manifesting in the shape of the end portions of the alumina 50, which is inevitable due to the limits to machining accuracy, expression (7) can be rewritten as;

$$3.807 \approx 0.0775 \lambda g \quad (8)$$

In addition, the physical characteristic length, the guide wavelength $\lambda gt_2$ of microwaves is determined as expressed below in correspondence to the mechanical length 3 mm (in the free space) of the areas of the waveguides filled with the Teflon 35.

$$\lambda gt_2 = 3/(2)^{1/2} \quad (9)$$

Expression (9) may be rewritten as;

$$3 = (2)^{1/2} \times \lambda gt_2 = (2)^{1/2} \times (3/\lambda c \times \lambda g) \quad (10)$$

With the machining limitations taken into consideration, expression (10) may be rewritten as;

$$3 \approx 0.0294 \lambda g \quad (11)$$

The physical characteristic length from the end surface C of each waveguide 30 to the center of the closest slot 31 is maintained at $\lambda g/4$ even when the alumina 50 is inserted in the waveguide. Thus, calculation can be executed as expressed below by using expressions (6), (8) and (11).

$$0.107 \lambda g \text{(guide wavelength} \quad (12)$$
$$\text{of waveguides filled with Teflon only)} =$$
$$0.0775 \lambda g + 0.0294 \lambda g \text{(the guide wavelength of waveguides}$$
$$\text{filled with Teflon and alumina)} = 0.107 \lambda g$$

Based upon the prerequisite that the right-hand side and the left-hand side in expression (12) match (i.e., the physical characteristic length measured from the end surface C to the center of the closest slot 31 is maintained at $\lambda g/4$), the inventor was able to reach the conclusion that a plurality of dielectric members 33 could be disposed with equal intervals over the entire ceiling surface of the processing chamber by setting the alumina insertion range in the free space to 3.807 mm and setting the Teflon insertion range in the free space to 3 mm.

Figure 6:
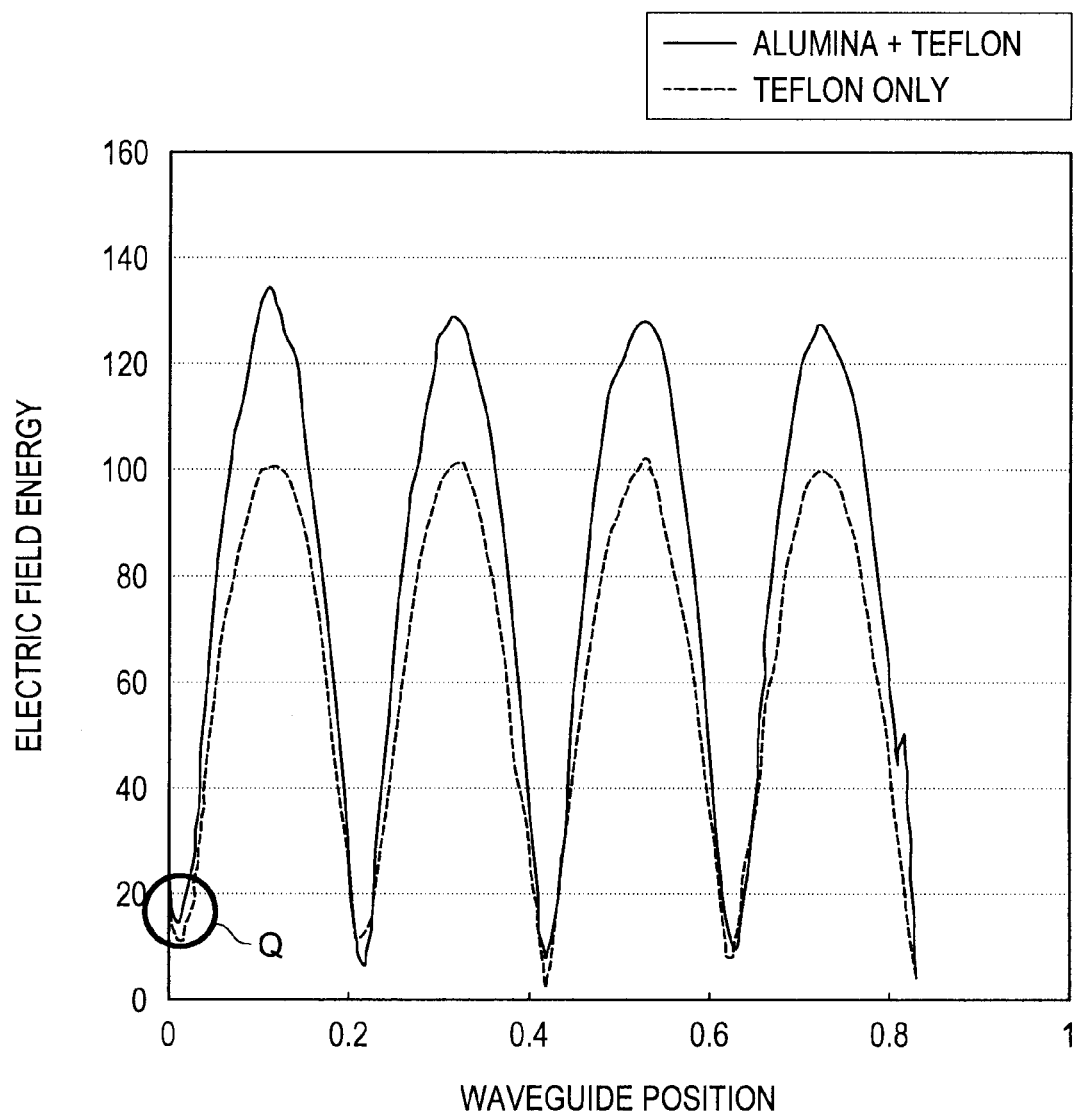
FIG. 6 presents a graph proving that the guide wavelengths of waveguide filled with Teflon alone and the waveguide filled with Teflon and alumina match.
Figure 7:
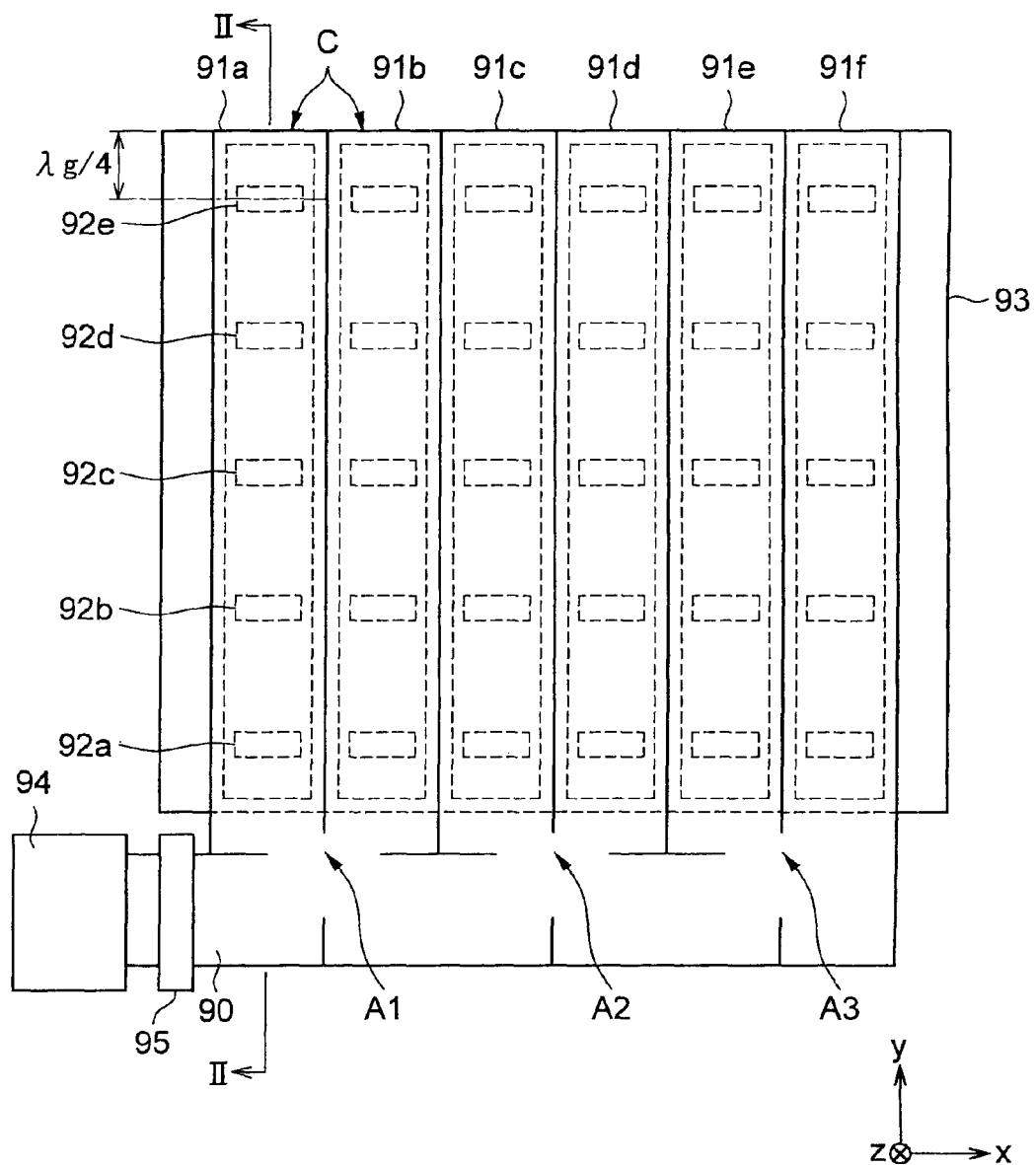
FIG. 7 presents an example of waveguides disposed at the ceiling surface of a plasma processing apparatus in the related art.

The solid line in FIG. 6 indicates the electrical field energy measured at various waveguide positions at a waveguide 30, the length of which was reduced by 4.093 mm (=10.9−3.807−3) by filling it with alumina near the end thereof over the alumina insertion range of 3.807 mm and filling the remaining space in the waveguide with Teflon over the Teflon insertion range of 3 mm. In addition, the dotted line in FIG. 6 indicates the electrical field energy measured in a waveguide filled with the Teflon 35 only. The diagram indicates that the displacement of the electrical field energy at the waveguide filled with the Teflon alone (the dotted line) and the displacement of the electrical field energy at the waveguide filled with the Teflon and the alumina (the solid curve) substantially match each other at a position (Q in FIG. 6) near the ends of the waveguides. Thus, the inventor was able to confirm that the guide wavelength $\lambda g$ of the microwaves at various dielectric members substantially matched, regardless of whether the waveguide 30 was filled with the Teflon 35 alone or the waveguide 30 was filled with the Teflon 35 over the 3 mm Teflon insertion range and also with the alumina 50 over the 3.807 mm alumina insertion range near the end of the waveguide 30.

Through the simulation described above, the inventor proved that the optimal values indicating the insertion ranges for the alumina 50 and the Teflon 35 to fill the space inside the waveguide 30 ranging from the end surface C to the slot 31 closest to the end surface C inside the waveguide 30, are 3.807 mm and 3 mm respectively.

The simulation results substantiated the accuracy of the conceptual assertion that by reducing the mechanical length of each waveguide 30 measured from the end surface C to the center of the slot closest to the end surface to the optimal value while maintaining the physical characteristic length between the end surface C and the closest slot center at $\lambda g/4$, dielectric members 33 can be distributed with equal intervals over the entire ceiling surface. The simulation results indicate that the mechanical length measured from the end surface C of the waveguide 30 to the center of the closest slot 31 can be reduced by approximately 4.1 mm compared to the mechanical length of the waveguide 30 in the related art filled with the Teflon 35 alone, while maintaining the physical characteristic length from the end surface C to the center of the closest slot 31 at $\lambda g/4$. The dead space D that would be formed under the end surfaces C of the waveguides 30 in the related art can be thus eliminated, making it possible to dispose a plurality of dielectric members 33 with equal intervals over the entire ceiling surface of the processing chamber U.

With microwaves of uniform power distributed evenly through the individual slots 32 into the processing chamber U over the entire ceiling surface, plasma was generated evenly with a high level of stability over the entire ceiling surface of the processing chamber U in the simulation. Consequently, desirable plasma processing, e.g., highly desirable film formation processing, could be executed accurately on the substrate G.

It is to be noted that the Teflon 35 explained above represents an example of the first wavelength-varying substance that adjusts the guide wavelength λg of the microwaves to the first wavelength. The alumina 50 represents an example of the second wavelength-varying substance that adjusts the guide wavelength λg of the microwaves to the second wavelength. In other words, substances other than the Teflon 35 and the alumina 50 may be used as the first wavelength-varying substance and the second wavelength-varying substance, as long as the first wavelength-varying substance and the second wavelength-varying substance sustain a relationship whereby the second wavelength-varying substance is a dielectric material achieving a higher dielectric constant $\in$ compared to that of the first wavelength-varying substance.

In addition, the substrate G undergoing the plasma processing in the microwave plasma processing apparatus 100 may be larger than 730 mm×920 mm. For instance, in the microwave plasma processing apparatus 100 shown in FIG. 2, a substrate G (in the G5 substrate size) measuring 1100 mm×1300 mm (corresponding to the chamber size of 1470 mm×1590 mm) is processed with the plasma formed with the power of microwaves output from the eight microwave generators 34 installed in two groups each made up with four microwave generators, facing opposite each other. However, the present invention is not limited to this particular example and may be adopted in a plasma processing apparatus assuming a structure corresponding to half of the plasma processing apparatus in FIG. 2, achieved by splitting it along the longitudinal direction at the center thereof with half the number of the waveguides 30, the tuners 38 and the microwave generators 34 relative to those in the plasma processing apparatus in FIG. 2, to process a substrate G (in the G4.5 substrate size) measuring 730 mm×920 mm (corresponding to the chamber size of 1000 mm×1190 mm) with the plasma generated with the power of microwaves output from the four microwave generators 34 disposed in two groups each made up of two microwave generators facing opposite each other. Microwaves achieving a power level of 1~8 W/cm$^2$ may be supplied into the processing chamber assuming the sizes described above.

The operations of the individual units executed in the embodiment as described above are correlated and thus, they may be regarded as a series of operations by bearing in mind how they relate to one another. By considering them as a sequence of operations, the embodiment of the present invention providing the plasma processing apparatus can be remodeled as a plasma processing method to be adopted in a plasma processing apparatus when processing a workpiece with plasma.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, the plasma processing apparatus according to the present invention should be capable of executing any type of plasma processing including film formation processing, diffusion processing, etching and ashing.

What is claimed is:

1. A plasma processing apparatus, comprising:
a plurality of waveguides through which microwaves are transmitted and wherein each waveguide is disposed so that an end surface of each of the plurality of waveguides faces opposite to an end surface of another waveguide;
a slot antenna that includes a plurality of slots adjacent to the waveguide, through which the microwaves propagated via the waveguides are passed;
a first wavelength-varying substance partially filling an inside of the waveguide, which alters a guide wavelength λg of the microwaves to a first wavelength;
a second wavelength-varying substance extending inside the waveguide over an area located between an end surface of the waveguide, where the microwaves are reflected, and a line extending from a center of a slot in the slot antenna closest to the end surface, which alters the guide wavelength λg of microwaves transmitted through the area to a second wavelength smaller than the first wavelength;
a plurality of dielectric members disposed adjacent to the slot antenna, through which the microwaves that passed through the plurality of slots at the slot antenna are transmitted; and
a processing chamber where a subject to be processed is processed by plasma generated with a gas excited by the microwaves transmitted through the plurality of dielectric members.

2. The plasma processing apparatus according to claim 1, wherein:
a physical characteristic length between the end surface and the closest slot center is ¼ of the guide wavelength λg.

3. The plasma processing apparatus according to claim 1, wherein:
the second wavelength-varying substance and the first wavelength-varying substance each include a dielectric material; and
a dielectric constant of the second wavelength-varying substance is higher than a dielectric constant of the first wavelength-varying substance.

4. The plasma processing apparatus according to claim 1, wherein:
the plurality of dielectric members are disposed over equal intervals.

5. The plasma processing apparatus of claim 4, wherein the plurality of dielectric members are disposed over equal intervals over an entire ceiling surface of the processing chamber.

6. The plasma processing apparatus according to claim 1, wherein:
each of the waveguides is set adjacent to 20 slots or less present side-by-side on an axis extending parallel to a length of the waveguide; and
a physical characteristic length between one slot and a next slot is ½ of the guide wavelength λg.

7. The plasma processing apparatus according to claim 1, wherein:
at least one of either recesses and projections are formed at surfaces of the plurality of dielectric members, which face opposite the subject to be processed.

8. The plasma processing apparatus according to claim 1, wherein:
   a size of the subject to be processed is equal to or more than 730 mm×920 mm.

9. The plasma processing apparatus according to claim 1, wherein:
   each of the waveguides is set adjacent to a plurality of slots side-by-side on an axis extending parallel to a length of the waveguide; and
   a physical characteristic length between one slot and a next slot is ½ of the guide wavelength λg.

10. An apparatus, comprising:
   a plurality of waveguides through which microwaves are transmitted and wherein each waveguide is disposed so that an end surface of each of the plurality of waveguides faces opposite to an end surface of another waveguide;
   a slot antenna that includes a plurality of slots adjacent to the waveguide, through which the microwaves propagated via the waveguide are passed;
   a first wavelength-varying substance partially filling an inside of the waveguide, which alters a guide wavelength λg of the microwaves to a first wavelength; and
   a second wavelength-varying substance extending inside the waveguide over an area located between an end surface of the waveguide, where the microwaves are reflected, and a line extending from a center of a slot in the slot antenna closest to the end surface, which alters the guide wavelength λg of microwaves transmitted through the area to a second wavelength smaller than the first wavelength.

* * * * *